United States Patent [19]

Confalonieri et al.

[11] Patent Number: 4,883,993
[45] Date of Patent: Nov. 28, 1989

[54] ANTIBOUNCE CIRCUIT FOR DIGITAL CIRCUITS

[75] Inventors: Pierangelo Confalonieri, Canonica d'Adda; Sergio Pernici, Bergamo; Germano Nicollini, Piacenze, all of Italy

[73] Assignee: SGS-Thomson Microelectronics srl., Agrate Brianza, Italy

[21] Appl. No.: 279,036

[22] Filed: Dec. 2, 1988

[30] Foreign Application Priority Data

Dec. 14, 1987 [IT]  Italy ................................. 22987A/87

[51] Int. Cl.$^4$ .................. H03K 17/16; H03K 19/003; H03K 5/00
[52] U.S. Cl. ..................... 307/542.1; 307/443
[58] Field of Search ................. 307/443, 542, 542.1, 307/234, 247.1, 272.2, 272.1; 328/109-112

[56] References Cited

U.S. PATENT DOCUMENTS 3,725,792  4/1973  Kellogg .......................... 307/443
3,786,276  1/1974  Rösch ............................. 307/443
4,506,165  3/1985  Gulati et al. ..................... 307/443

FOREIGN PATENT DOCUMENTS 0045859  4/1977  Japan ............................. 307/542.1
0085929  7/1981  Japan ............................. 307/542.1

Primary Examiner—Stanley D. Miller
Assistant Examiner—Timothy P. Callahan
Attorney, Agent, or Firm—Stevens, Davis, Miller & Mosher

[57] ABSTRACT

The antibounce circuit comprises:
(a) a first flip-flop constituted by a first and a second NAND gate (10, 12) having their respective outputs connected to one of the inputs of the other gate, the free input of the first gate being the input for said digital signal;
(b) a second flip-flop constituted by a third and fourth NAND gate (14, 16) having their respective outputs connected to one of the inputs of the other gate, the free input of the third gate being connected to the output of the first gate;
(c) a non-inverting delay circuit (20, 22, 24) connecting the output of the third gate to the free input of the second gate;
(d) a first inverter connecting the output of the delay circuit to the free input of the fourth gate.

5 Claims, 1 Drawing Sheet

4,883,993

ANTIBOUNCE CIRCUIT FOR DIGITAL CIRCUITS

BACKGROUND OF THE INVENTION

1. Field of the Invention

The present invention relates to an antibounce circuit for digital circuits for eliminating the value oscillations occurring in certain digital signals when switching between two states.

An example of a signal which can bounce one or more times during state switching before stabilizing at the new level occurs in a high-resolution analog comparator used to detect when a low-frequency analog signal exceeds a certain threshold. As soon as the signal exceeds the threshold by a very low preset value, equal to the sensitivity of the comparator (e.g. 500 microvolts), a transition of the logical output level of the comparator occurs. However, due to the noise possibly affecting it, the analog input signal can drop back below the threshold for a short time even more than once before rising finally above it, thus producing a digital comparator output signal affected by bounces.

2. Prior Art

In order to eliminate these bounces, antibounce circuits are known which generally wait for these oscillations to end before detecting the actual switching. This however has the disadvantage that the switching is not detected immediately, but with a delay equal to the antibounce time.

Said known antibounce circuits generally also have the disadvantage of not safely recognizing partial bounces or oscillations (i.e. bounces or oscillations which do not completely return to the signal's previous state or level), giving rise either to an even longer detection delay or to the incomplete elimination of the bounces.

SUMMARY OF THE INVENTION

The aim of the present invention is to provide a simple and reliable digital antibounce circuit which immediately detects the input transition without the above described delay.

An object of the invention is to provide an antibounce circuit which operates safely and without errors even in the presence of partial oscilations of the input signal.

This aim and this object, as well as others which will become apparent hereinafter, are achieved by the invention with an antibounce circuit for digital signals, characterized in that it comprises:

(a) a first flip-flop constituted by a first and a second NAND gate having their respective outputs connected to one of the inputs of the other gate, the free input of the first gate being the input for said digital signal;

(b) second flip-flop constituted by a third and a fourth NAND gate having their respective outputs connected to one of the inputs of the other gate, the free input of the third gate being connected to the output of the first gate;

(c) a non-inverting delay circuit connecting the output of the third gate to the free input of the second gate;

(d) a first inverter connecting the output of said delay circuit to the free input of the fourth gate.

BRIEF DESCRIPTION OF THE DRAWINGS

A preferred embodiment of the invention is now described merely by way of non-limitative example with reference to the accompanying drawings, wherein.

DETAILED DESCRIPTION OF THE PREFERRED EMBODIMENTS

Figure 1:
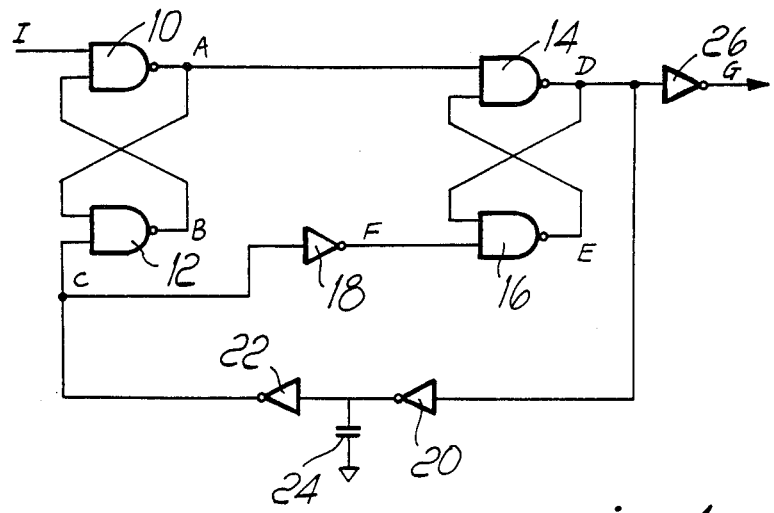
FIG. 1 is the diagram of a preferred embodiment of the antibounce circuit according to the invention.
Figure 2:
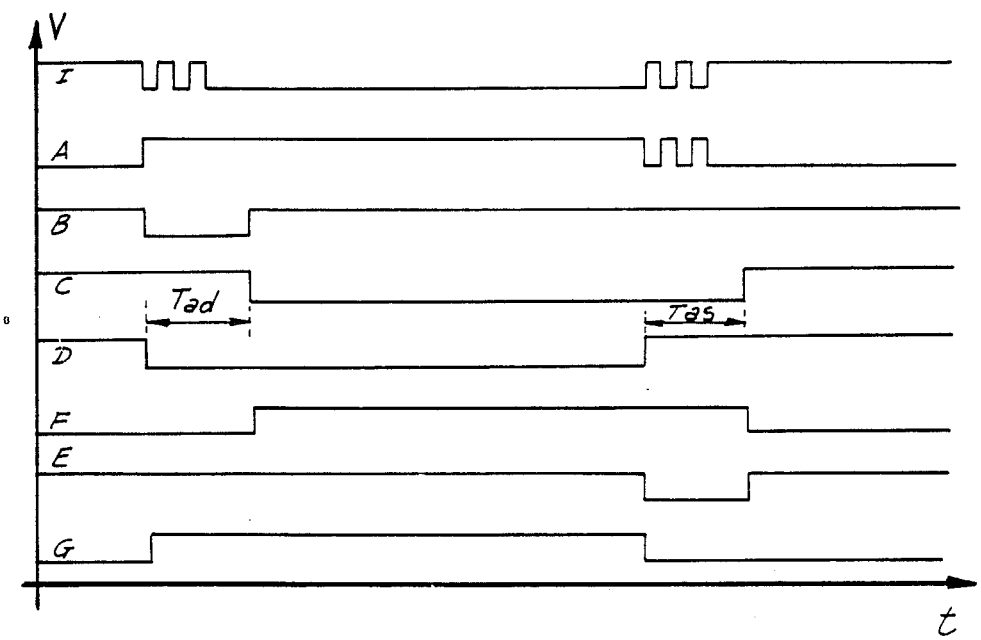
FIG. 2 is a series of graphs of signals occurring in the operation of the circuit of FIG. 1.

With reference to FIG. 1, the antibounce circuit according to the preferred embodiment of the invention comprises a first flip-flop constituted in a known manner by two NAND gates 10 and 12, the output A of the gate 10 being connected to one of the inputs of the gate 12 and the output B of the gate 12 being connected to one of the inputs of the gate 10. The other input I of the gate 10 (hereinafter termed "free input" to distinguish it from the one connected to the output of the other gate) receives the digital signal from which the bounces must be purged. The free input C of the gate 12 is driven as described hereafter.

A second flip-flop comprises two NAND gates 14 and 16 respectively having outputs D and E mutually connected similarly to the gates 10 and 12. The free input of the gate 14 is connected to the output A of the gate 10, while the free input F of the gate 16 is connected to the free input C of the gate 12 through an inverter 18.

Finally, the output D of the gate 14 of the second flip-flop drives the free input C of the gate 12 of the first flip-flop through a delay circuit constituted by two cascade coupled inverters 20 and 22, their common node being connected to the ground by means of a capacitor 24.

The output D of the second flip-flop is inverted in an inverter 26 to provide the output signal on a node G.

In static conditions, and indicating the high logical level and the low logical level of the signals respectively with 1 and 0, it can be seen that when I=1 in the circuit of FIG. 1, a single stability value occurs for each node, i.e. A=0, B=1, C=1, D=1, F=0, E=1, G=0. If instead I=0, it can be seen that necessarily A=1, B=1, C=0, D=0, F=1, E=1, G=1.

In order to analyze the behavior of the circuit when bounces occur it is now assumed that the node I switches from 1 to 0. Then, due to the NAND gate 10, A becomes 1. Since E=1 and A=1, the output D of the NAND gate 14 become 0, and the node G, which is the negated output of the circuit, becomes 1. The node C senses the switching of D only after a delay time $T_{ad}$ equal to the time required to switch the pair of inverters 20 and 22. Thus C remains at 1 for the time $T_{ad}$ after the switching of D, then becomes 0. Immediately after the switching of I from 1 to 0, then thus has C=1, A=1, B=0.

If the signal on the node I now bounces so that it returns to 1, the fact that B remains at 0 leaves the state of A unchanged, and the bounce therefore does not propagate from I to A. Only after C has dropped to 0, at the end of the time $T_{ad}$, can B become 1, the system being therefore capable of detecting the switching of the node I. For all the time $T_{ad}$, A and C remains at 1, so that F=0, E=1, and therefore D, being the output of a NAND gate with both its inputs at 1, is 0.

In order to make the circuit immune to bounces in the transitions of I from 1 to 0, the delay time $T_{ad}$ must therefore be longer than the time in which bounces may occur. The time $T_{ad}$ can be adjusted in a known manner by causing the inverter 20 to be resistive towards the high power supply and by choosing an appropriate value for the capacitor 24.

If the behavior of the circuit of FIG. 1 when the signal on the node I switches from 0 to 1 is now examined, it can be seen that in this case, too, C remains at 0 for a delay time $T_{as}$ with respect to the raising edge of the pair of inverters 20 and 22. The time $T_{as}$ can be set by acting on the resistance of the inverter 20 towards the low power supply. It can be observed that in this case too, the signal on the output node G switches at the first transition of the input signal (node I) without being affected by any bounces occurring in the interval $T_{as}$. In fact in this case the second flip-flop is insensitive to the variations of the node A while C, and therefore F, remain stable due to the delay introduced by the network 20, 22, 24.

Though $T_{ad}$ and $T_{as}$ can generally be different, usually they are chosen identical according to the time for which bounces are deemed to possibly occur.

The delay circuit comprising the inverters 20, 22 and the capacitor 24 can be replaced, within the scope of the invention, by a known non-inverting digital delay circuit.

The bounces affecting the output signal of a high-resolution comparator are generally complete, i.e. such as to return the signal from 1 to 0 or vice versa, but in other applications the signal may stop at an intermediate level in bouncing. This may give rise to uncertainties in switching on the output G. In fact, if the input I switches from 1 to 0, the antibounce effect is reached when B reaches 0, while if A, in switching from 1 to 0, reaches a merely intermediate level insufficient to switch B to 0, this effect is not produced, and A returns to 0 when I returns to 1: this voltage variation may be detected by D and transferred to the output G, causing the above described malfunction.

According to the invention, in order to obviate this disadvantage the switching threshold of the gate 12 relatively to the input A is chosen much lower than that of the gate 14 relatively to said input, so that variations not exceeding the switching threshold of the NAND 12 cannot be transmitted in output. If I goes from 0 to 1, the same criterion is applied to the input D of the gate 16, providing a lower switching threshold than that of the inverter 26.

A preferred embodiment of the invention has been described, but it is understood that it is susceptible to equivalent modifications and variations by the expert in the field according to the teachings given, without thereby abandoning the scope of the inventive concept.

We claim:

1. Antibounce circuit for digital signals, characterized in that it comprises:
   (a) a first flip-flop constituted by a first and a second NAND gate (10, 12) having their respective outputs connected to one of the inputs of the other gate, the free input of the first gate being the input for said digital signal;
   (b) a second flip-flop constituted by a third and a fourth NAND gate (14, 16) having their respective outputs connected to one of the inputs of said other gate, the free input of said third gate being connected to the output of said first gate;
   (c) a non-inverting delay circuit (20, 22, 24) connecting the output of said third gate to the free input of said second gate;
   (d) a first inverter connecting the output of said delay circuit to the free input of said fourth gate.

2. Antibounce circuit according to claim 1, characterized in that a second inverter (26) is connected at the output of said third gate (14), its output constituting the output of the antibounce circuit.

3. Antibounce circuit according to claim 1, characterized in that said delay circuit comprises a pair of cascade coupled inverters (20, 22) and a capacitor (24) between their common node and the ground, the first inverter of said pair of inverters being resistive both towards the high power supply and towards the low power supply.

4. Antibounce circuit according to claim 1, characterized in that the switching threshold of said second gate (12) relatively to its input connected to the output of said first gate (10) is lower than the switching threshold of said third gate (14) relatively to its input connected to the output of said first gate (10).

5. Antibounce circuit according to claim 2, characterized in that the switching threshold of said fourth gate (16) relatively to its input connected to the output of said third gate (14) is lower than the switching threshold of said second inverter (26).

* * * * *